(12) United States Patent
Wang et al.

(10) Patent No.: US 7,791,950 B2
(45) Date of Patent: *Sep. 7, 2010

(54) INVERTER NON-VOLATILE MEMORY CELL AND ARRAY SYSTEM

(75) Inventors: Bin Wang, Seattle, WA (US); Shih-Hsin Wang, San Jose, CA (US); William T. Colleran, Seattle, WA (US)

(73) Assignee: Virage Logic Corporation, Fremont, CA (US)

( * ) Notice: Subject to any disclaimer, the term of this patent is extended or adjusted under 35 U.S.C. 154(b) by 202 days.

This patent is subject to a terminal disclaimer.

(21) Appl. No.: 11/748,541

(22) Filed: May 15, 2007

(65) Prior Publication Data

US 2007/0263456 A1  Nov. 15, 2007

Related U.S. Application Data

(63) Continuation of application No. 11/084,214, filed on Mar. 17, 2005, now Pat. No. 7,257,033.

(51) Int. Cl.
*G11C 16/04* (2006.01)
(52) U.S. Cl. .................. 365/185.28; 365/185.29; 365/185.26; 365/185.17; 365/185.05
(58) Field of Classification Search ........... 365/185.28, 365/185.29, 185.26, 185.17, 185.05
See application file for complete search history.

(56) References Cited

U.S. PATENT DOCUMENTS

| | | | |
|---|---|---|---|
| 4,037,242 A | 7/1977 | Gosney | |
| 4,158,239 A | 6/1979 | Bertin | |
| 4,541,073 A | 9/1985 | Brice et al. | |
| 4,571,704 A | 2/1986 | Bohac, Jr. | |
| 4,758,869 A | 7/1988 | Eitan et al. | |
| 4,899,070 A | 2/1990 | Ou et al. | |
| 4,935,702 A | 6/1990 | Mead et al. | |
| 5,016,217 A | 5/1991 | Brahmbhatt | |
| 5,018,102 A | 5/1991 | Houston | |
| 5,068,622 A | 11/1991 | Mead et al. | |
| 5,086,331 A | 2/1992 | Hartgring et al. | |
| 5,101,378 A | 3/1992 | Radjy et al. | |
| 5,124,568 A | 6/1992 | Chen et al. | |

(Continued)

FOREIGN PATENT DOCUMENTS

EP  0 298 618  1/1989

(Continued)

OTHER PUBLICATIONS

Carley, L. Richard, "Trimming Analog Circuits Using Floating-Gate Analog MOS Memory", IEEE Journal of Solid-State Circuits, vol. 24, No. 6, pp. 1569-1575, Dec. 1989.

(Continued)

*Primary Examiner*—Connie C Yoha
(74) *Attorney, Agent, or Firm*—Nixon Peabody LLP; David B. Ritchie

(57) ABSTRACT

NVM arrays include rows and columns of NVM cells comprising a floating gate and a four transistor storage element. Supply voltage for selected storage elements is turned off during a programming and an erase mode. Isolation transistors for each NVM cell or for each row of NVM cells may be used to control the supply voltage.

30 Claims, 5 Drawing Sheets

U.S. PATENT DOCUMENTS

| | | |
|---|---|---|
| 5,197,028 A | 3/1993 | Nakai |
| 5,272,368 A | 12/1993 | Turner et al. |
| 5,323,066 A | 6/1994 | Feddeler et al. |
| 5,430,670 A | 7/1995 | Rosenthal |
| 5,438,542 A | 8/1995 | Atsumi et al. |
| 5,450,363 A | 9/1995 | Christopherson et al. |
| 5,463,348 A | 10/1995 | Sarpeshkar et al. |
| 5,515,317 A | 5/1996 | Wells et al. |
| 5,517,044 A | 5/1996 | Koyama |
| 5,541,878 A | 7/1996 | LeMoncheck et al. |
| 5,574,879 A | 11/1996 | Wells et al. |
| 5,596,524 A | 1/1997 | Lin et al. |
| 5,617,358 A | 4/1997 | Kodama |
| 5,627,392 A | 5/1997 | Diorio et al. |
| 5,633,518 A | 5/1997 | Broze |
| 5,659,498 A | 8/1997 | Pascucci et al. |
| 5,666,307 A | 9/1997 | Chang |
| 5,677,917 A | 10/1997 | Wheelus et al. |
| 5,687,118 A | 11/1997 | Chang |
| 5,691,939 A | 11/1997 | Chang et al. |
| 5,706,227 A | 1/1998 | Chang et al. |
| 5,717,636 A | 2/1998 | Dallabora et al. |
| 5,729,155 A | 3/1998 | Kobatake |
| 5,731,716 A | 3/1998 | Pascucci |
| 5,736,764 A | 4/1998 | Chang |
| 5,761,121 A | 6/1998 | Chang |
| 5,777,361 A | 7/1998 | Parris et al. |
| 5,777,926 A | 7/1998 | Trinh et al. |
| 5,787,038 A | 7/1998 | Park |
| 5,790,060 A | 8/1998 | Tesch |
| 5,796,656 A | 8/1998 | Kowshik et al. |
| 5,798,967 A | 8/1998 | Sarin et al. |
| 5,801,994 A | 9/1998 | Chang et al. |
| 5,825,063 A | 10/1998 | Diorio et al. |
| 5,835,402 A | 11/1998 | Rao et al. |
| 5,841,165 A | 11/1998 | Chang et al. |
| 5,844,300 A | 12/1998 | Alavi et al. |
| 5,854,762 A | 12/1998 | Pascuccui |
| 5,864,569 A | 1/1999 | Roohparvar |
| 5,875,126 A | 2/1999 | Minch et al. |
| 5,886,566 A | 3/1999 | Park et al. |
| 5,892,712 A | 4/1999 | Hirose et al. |
| 5,898,613 A | 4/1999 | Diorio et al. |
| 5,901,084 A | 5/1999 | Ohnakado |
| 5,912,841 A | 6/1999 | Kim |
| 5,912,842 A | 6/1999 | Chang et al. |
| 5,912,937 A | 6/1999 | Goetting et al. |
| 5,914,894 A | 6/1999 | Diorio et al. |
| 5,939,945 A | 8/1999 | Thewes et al. |
| 5,966,329 A | 10/1999 | Hsu et al. |
| 5,969,987 A | 10/1999 | Blyth et al. |
| 5,972,804 A | 10/1999 | Tobin et al. |
| 5,982,669 A | 11/1999 | Kalnitsky et al. |
| 5,986,927 A | 11/1999 | Minch et al. |
| 5,990,512 A | 11/1999 | Diorio et al. |
| 6,002,623 A | 12/1999 | Stave et al. |
| 6,028,789 A | 2/2000 | Mehta et al. |
| 6,055,185 A | 4/2000 | Kalnitsky et al. |
| 6,060,919 A | 5/2000 | Wilson et al. |
| 6,081,451 A | 6/2000 | Kalnitsky et al. |
| 6,097,637 A | 8/2000 | Bauer et al. |
| 6,111,785 A | 8/2000 | Hirano |
| 6,125,053 A | 9/2000 | Diorio et al. |
| 6,130,612 A | 10/2000 | Castellano et al. |
| 6,137,153 A | 10/2000 | Le et al. |
| 6,137,722 A | 10/2000 | Kalnitsky et al. |
| 6,137,723 A | 10/2000 | Bergemont et al. |
| 6,137,724 A | 10/2000 | Kalnitsky et al. |
| 6,141,247 A | 10/2000 | Roohparvar et al. |
| 6,144,581 A | 11/2000 | Diorio et al. |
| 6,166,954 A | 12/2000 | Chern |
| 6,166,978 A | 12/2000 | Goto |
| 6,190,968 B1 | 2/2001 | Kalnitsky et al. |
| 6,208,557 B1 | 3/2001 | Bergemont et al. |
| 6,214,666 B1 | 4/2001 | Mehta |
| 6,222,765 B1 | 4/2001 | Nojima |
| 6,233,717 B1 | 5/2001 | Choi |
| 6,294,427 B1 | 9/2001 | Furuhata et al. |
| 6,320,788 B1 | 11/2001 | Sansbury et al. |
| 6,331,949 B1 | 12/2001 | Hirano |
| 6,353,568 B1 | 3/2002 | Sung |
| 6,359,810 B1 | 3/2002 | Gupta et al. |
| 6,363,006 B2 | 3/2002 | Naffziger et al. |
| 6,363,008 B1 | 3/2002 | Wong |
| 6,363,011 B1 | 3/2002 | Hirose et al. |
| 6,384,451 B1 | 5/2002 | Caywood |
| 6,452,835 B1 | 9/2002 | Diorio et al. |
| 6,456,992 B1 | 9/2002 | Shibaia et al. |
| 6,469,930 B1 | 10/2002 | Murray |
| 6,469,937 B2 | 10/2002 | Fuchigami et al. |
| 6,477,103 B1 | 11/2002 | Nguyen et al. |
| 6,479,863 B2 | 11/2002 | Caywood |
| 6,522,584 B1 | 2/2003 | Chen et al. |
| 6,529,407 B2 | 3/2003 | Shukuri |
| 6,534,816 B1 | 3/2003 | Caywood |
| 6,549,457 B1 | 4/2003 | Srinivasan et al. |
| 6,558,967 B1 | 5/2003 | Wong |
| 6,563,731 B1 | 5/2003 | Bergemont |
| 6,573,765 B2 | 6/2003 | Bales et al. |
| 6,590,825 B2 | 7/2003 | Tran et al. |
| 6,594,196 B2 | 7/2003 | Hsu et al. |
| 6,611,463 B1 | 8/2003 | Mehta et al. |
| 6,633,188 B1 | 10/2003 | Jia et al. |
| 6,646,919 B1 | 11/2003 | Madurawe et al. |
| 6,654,272 B2 | 11/2003 | Santin et al. |
| 6,654,286 B2 | 11/2003 | Kawakami |
| 6,661,278 B1 | 12/2003 | Gilliland |
| 6,664,909 B1 | 12/2003 | Hyde et al. |
| 6,678,190 B2 | 1/2004 | Yang et al. |
| 6,693,819 B2 | 2/2004 | Smith et al. |
| 6,693,829 B2 | 2/2004 | Babudri et al. |
| 6,714,451 B2 | 3/2004 | Ooishi et al. |
| 6,724,657 B2 | 4/2004 | Shukuri |
| 6,741,500 B2 | 5/2004 | DeShazo et al. |
| 6,791,881 B2 | 9/2004 | Shukuri et al. |
| 6,822,894 B1 | 11/2004 | Costello et al. |
| 6,845,029 B2 | 1/2005 | Santin et al. |
| 6,845,039 B2 | 1/2005 | Chen et al. |
| 6,845,044 B2 | 1/2005 | Horch et al. |
| 6,853,583 B2 | 2/2005 | Diorio et al. |
| 6,865,128 B2 | 3/2005 | Kanai |
| 6,870,767 B2 | 3/2005 | Rudelic et al. |
| 6,898,105 B2 | 5/2005 | Sakai et al. |
| 6,946,892 B2 | 9/2005 | Mitarashi |
| 6,950,342 B2 | 9/2005 | Lindhorst et al. |
| 6,995,436 B2 | 2/2006 | Kawasaki |
| 6,999,887 B2 | 2/2006 | Rehm et al. |
| 7,032,064 B2 | 4/2006 | Barnett et al. |
| 7,057,935 B2 | 6/2006 | Chevallier |
| 7,272,041 B2 | 9/2007 | Rahman et al. |
| 7,283,390 B2 | 10/2007 | Pesavento |
| 7,403,122 B1 | 7/2008 | Koepp et al. |
| 7,463,155 B2 | 12/2008 | Narlow et al. |
| 2002/0008271 A1 | 1/2002 | Hsu et al. |
| 2002/0122331 A1 | 9/2002 | Santin et al. |
| 2003/0123276 A1 | 7/2003 | Yokozeki |
| 2003/0183871 A1 | 10/2003 | Dugger et al. |
| 2003/0206437 A1 | 11/2003 | Diorio et al. |
| 2004/0004861 A1 | 1/2004 | Srinivas et al. |
| 2004/0021166 A1 | 2/2004 | Hyde et al. |
| 2004/0037127 A1 | 2/2004 | Lindhorst et al. |
| 2004/0052113 A1 | 3/2004 | Diorio et al. |
| 2004/0195593 A1 | 10/2004 | Diorio et al. |
| 2005/0063235 A1 | 3/2005 | Pesavento et al. |

| | | |
|---|---|---|
| 2005/0149896 A1 | 7/2005 | Madurawe |
| 2006/0077737 A1 | 4/2006 | Ooishi |
| 2006/0209598 A1 | 9/2006 | Wang et al. |
| 2006/0221715 A1 | 10/2006 | Ma et al. |
| 2007/0229230 A1 | 10/2007 | Drago et al. |

FOREIGN PATENT DOCUMENTS

| | | |
|---|---|---|
| EP | 0336500 | 3/1989 |
| EP | 0326883 | 8/1989 |
| EP | 0756379 | 1/1997 |
| EP | 0 776 049 | 5/1997 |
| EP | 0 778 623 | 6/1997 |

OTHER PUBLICATIONS

Declercq et al., "Design and Optimization of High-Voltage CMOS Devices Compatible With a Standard 5 V CMOS Technology", IEEE Custom Integrated Circuits Conference, 1993, pp. 24.6.1-24.6.4.

Dickson, "On-Chip High-Voltage Generation in MNOS Integrated Circuits Using an Improved Voltage Multiplier Technique", IEEE Journal of Solid-State Circuits, vol. SC-11, No. 3, Jun. 1976, pp. 374-378.

IBM Technical Disclosure Bulletin, Fuse Circuit With Zero DC Current, Jul. 1987, IBM Corporation, vol. 30, No. 2, pp. 1.

International Search Report, Application No. PCT/US03/31792, dated Aug. 12, 2004.

International Search Report for International Application No. PCT/US05/10434, dated Sep. 13, 2005.

International Search Report for International Application No. PCT/US2005/010432, dated Sep. 27, 2005.

International Search Report for International Application No. PCT/US2005/010431, dated Sep. 27, 2005.

Invitation to Pay Additional Fees for PCT/US03/31792, dated Apr. 2, 2004.

Notification of Transmittal of International Preliminary Examination Report on Patentability, International Application No. PCT/US05/10432, date mailed Jun. 19, 2006.

Raszka, Jaroslav, et al., "Embedded Flash Memory for Security Applications in a 0.13μm CMOS Logic Process", IEEE 2004 International Solid-State Circuits Conference, Feb. 16, 2004, pp. 46-47.

Witters, et al., "Analysis and Modeling of On-Chip High-Voltage Generator Circuits for Use in EEPROM Circuits", IEEE Journal of Solid-State Circuits, vol. 24, No. 5, Oct. 1989, pp. 1372-1380.

Chang, L. et al., "Non-Volatile Memory Device With True CMOS Compatibility", Electronics Letters, vol. 35, No. 17, Aug. 19, 1999, pp. 1443-1445.

Chang, Leland et al., "A CMOS-Compatible Single-Poly Cell for Use As Non-Volatile Memory", International Semiconductor Device Research Symposium, Dec. 1-3, 1999, pp. 57-60.

Chung, S.S. et al., "N-Channel Versus P-Channel Flash Eeprom-Which One Has Better Reliabilities", 39th Annual IEEE International Reliability Physics Symposium, 2001, pp. 67-72.

Diorio, C. et al., "A High-Resolution Non-Volatile Analog Memory Cell", IEEE International Symposium on Circuits and Systems, vol. 3, 1995, pp. 2233-2236.

Diorio, C et al., "A Floating-Gate MOS Learning Array with Locally Computed Weight Updates" IEEE Transactions on Electron Devices, vol. 44, No. 12, Dec. 1997, pp. 1-10.

Diorio, C., "A p-Channel MOS Synapse Transistor with Self-Convergent Memory Writes", IEEE Transaction on Electron Devices, vol. 47, No. 2, Feb. 2000, pp. 464-472.

Herdt, C. et al., "Analysis, Measurement, and Simulation of Dynamic Write Inhibit in an nvSRAM Cell", IEEE Transactions on Electron Devices, vol. 39, No. 5, May 1992, pp. 1191-1196.

Ma, Yanjun et al., "Reliability of pFET EEEPROM With 70-Å Tunnel Oxide Manufactured in Generic Logic CMOS Processes", IEEE Transactions on Device and Materials Reliability, vol. 4, No. 3, pp. 353-358, Sep. 2004.

Shi, Y. et al., "Polarity Dependent Gate Tunneling Currents in Dual-Gate CMOSFET's", IEEE Transactions on Electron Devices, vol. 45, No. 11, Nov. 1998, pp. 2355-2360.

Usuki, T. et al., "Direct Tunneling Memory: Trade-off Between Nonvolatility and High-Endurance with Low Voltage Operations", Nonvolatile Semiconductor Workshop Symposium, Aug. 12, 2001, pp. 80-81.

Vittoz, E., "Dynamic Analog Techniques", Design of Analog-Digital VLSI Circuits for Telecommunications and Signal Processing, Second Edition, Chapter 4, 1994, pp. 97-124.

Invitation to Pay Additional Fees for Application No. PCT/US2005/015606, date of mailing Nov. 18, 2005.

International Search Report and Written Opinion for International Application No. PCT/US2005/015606, date of mailing Feb. 24, 2006.

INVERTER NON-VOLATILE MEMORY CELL AND ARRAY SYSTEM

RELATED APPLICATIONS

This application is a Continuation application of U.S. Utility application Ser. No. 11/084,214 filed on Mar. 17, 2005 now U.S. Pat. No. 7,257,033.

This application is related to U.S. Utility application Ser. No. 10/813,907 filed on Mar. 30, 2004, Ser. No. 10/814,866 filed on Mar. 30, 2004, and Ser. No. 10/814,868 filed on Mar. 30, 2004. All three Applications are incorporated herein by reference.

FIELD OF THE INVENTION

The present invention relates to non-volatile memory cell and array structures, and more particularly, to methods and apparatus for programming, reading or erasing such structures.

BACKGROUND OF THE INVENTION

Memory circuits may be classified in two main categories: volatile and nonvolatile. Volatile memory loses any data as soon as the system is turned off. Thus, it requires constant power to remain viable. Most types of random access memory (RAM) fall into this category. Non-volatile memory does not lose its data when the system or device is turned off. A non-volatile memory (NVM) device may be implemented as a MOS transistor that has a source, a drain, an access or a control gate, and a floating gate. It is structurally different from a standard MOSFET in its floating gate, which is electrically isolated, or "floating".

Non-volatile memory arrays include a plurality of NVM cells arranged in rows and columns. In general, single-transistor n-channel NVM cells operate as follows. During an erase operation, electrons are removed from a floating gate of the NVM cell, thereby lowering the threshold voltage of the NVM cell. During a program operation, electrons are inserted into the floating gate of the NVM cell, thereby raising the threshold voltage of the NVM cell. Thus, during program and erase operations, the threshold voltages of selected NVM cells are changed. During a read operation, read voltages are applied to selected NVM cells. In response, read currents may flow through the selected NVM cells. The magnitudes of the read currents are dependent upon the threshold voltages of the selected NVM cells. In another configuration, output voltages of the NVM cells may be varied between two values based on the threshold voltages of those cells.

SUMMARY

The disclosure facilitates storage of digital information in a non-volatile memory circuit. Accordingly, the disclosure provides programming, erasing, and reading of non-volatile memory arrays.

In some embodiments, supply voltages for storage elements of NVM cells forming an NVM array are turned off during programming and erase modes enabling a reduction in current consumption by the storage elements. Turning on and off of the supply voltages for the storage elements may also be employed to select particular columns of the NVM array.

While example embodiments are shown using a floating gate, dual transistor storage element, the principles disclosed herein may be implemented in other types of NVM cells. Thus, the invention is not limited to the illustrated examples.

BRIEF DESCRIPTION OF THE DRAWINGS

Non-limiting and non-exhaustive embodiments are described with reference to the following drawings.

DETAILED DESCRIPTION

Figure 1A:
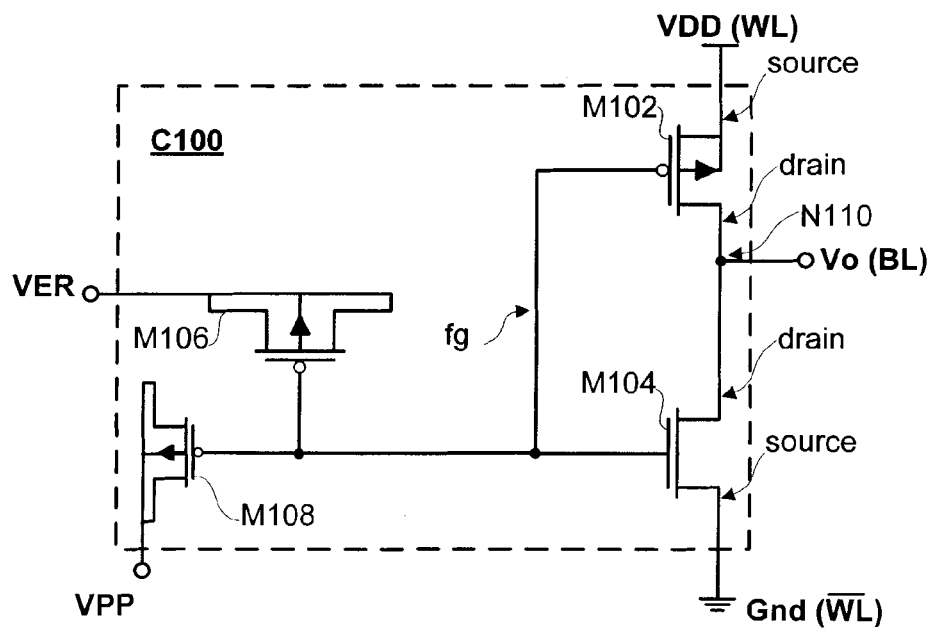
FIG. 1A schematically illustrates one embodiment of an inverter based non-volatile memory (NVM) cell with a floating gate programming circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other measurable quantity. The term "cell" means a unit NVM circuit comprising of a programming and a storage element that are arranged to store one bit. The term "array, refers to a plurality of NVM cells arranged in columns and rows.

FIG. 1A schematically illustrates one embodiment of inverter based non-volatile memory (NVM) cell C100 with a floating gate programming circuit.

In general, dual transistor inverter NVM cells operate as follows. During an erase operation, electrons are removed from a floating gate of the NVM cell, thereby adjusting a switch point voltage of the inverter NVM cell such that an output voltage corresponds to "0" when supply voltage is applied to the storage element. During a program operation, electrons are inserted into the floating gate of the NVM cell, thereby adjusting the switch point voltage of the inverter NVM cell such that the output voltage corresponds to "1" when supply voltage is applied to the storage element. Thus, during program and erase operations, the switch point voltages of selected NVM cells are changed. During a read operation, supply voltages are applied to the storage elements of the selected NVM cells. In response, output voltages of these selected NVM cells reflect a bit value based on the stored charges in their floating gates.

Floating gate type NVM cells may include programming circuits that are arranged to inject electrons to the floating gate of the storage element employing one of impact-ionized hot-electron injection, Fowler-Nordheim (FN) tunneling, channel hot-electron tunneling, and band-to-band tunneling induced electron injection.

Specifically, NVM cell C100 includes first programming transistor M106, second programming transistor M108, first storage transistor M102, and second storage transistor M104. First storage transistor M102 and second storage transistor M104 are arranged to share floating gate fg.

First programming transistor M106 and second programming transistor M108 together form the programming element of cell C100. First programming transistor M106 and second programming transistor M108 are coupled together at their gate terminals and share the floating gate with M102 and M104. A source, a drain, and an n-well terminal of first programming transistor M106 are coupled together to a first programming voltage VER. A source, a drain, and an n-well terminal of second programming transistor M108 are coupled together to a second programming voltage VPP.

The programming element is arranged such that electrons are injected onto the shared floating gate fg when first programming voltage VER has a high value and second programming voltage VPP has a low value. High and low values for the programming voltages may be predetermined based on a type and size of transistors used for M106 and M108. Electrons are removed from the shared floating gate, when first programming voltage VER has the low value and second programming voltage VPP is set to the high value. First programming transistor M106 is preselected such that its area is larger than the areas of second programming transistor M108, first storage transistor M102 and second storage transistor M104. In one embodiment, a size ratio between M106 and M108 may be between about four and about five. However, the invention is not limited to this ratio.

In a programming operation, a high value for programming voltage VER (e.g. ~10V) is applied to the source, drain, and n-well terminals of M106 (larger size transistor) and about 0V is applied to the source, drain, and n-well terminals of M108 (smaller size transistor). As a result, the shared floating gate fg is coupled at about +9V due to an effect of size difference. This results in about 9V across the smaller transistor from its gate terminal to its source, drain, and n-well terminals, and electrons are attracted to shared floating gate fg. On the other hand, there is only about 1V across M106 transistor, thus no current flow.

In an erase operation, a high value for programming voltage VPP (e.g. ~10V) is applied to the source, drain, and n-well terminals of M108 (smaller size transistor) and about 0V is applied to the source, drain, and n-well terminals of M106. As a result, the floating gate is coupled at about 1V due to the size difference effect. This results in about 9V (10V−1V) across the smaller transistor from its source, drain, and n-well terminals to its gate terminal, and electrons are removed from shared floating gate fg.

For either erase or programming operations, there is about 9V across the smaller transistor (M108) with a different polarity in each case. The polarity of the 9V determines a flowing direction of the electrons resulting in either programming or erase operations.

The storage element of cell C100 is formed by first storage transistor M102 and second storage transistor M104. A drain terminal of first storage transistor M102 is coupled to a drain terminal of second storage transistor M104, and the two storage transistors share a common floating gate as mentioned above. A source terminal of M102 is arranged to receive high supply voltage VDD, also referred to as word line signal WL. A source terminal of M104 is arranged to receive low supply signal GND, also referred to as inverted WL. In one embodiment, low supply signal may be a ground signal. Output voltage V0, also termed bit line signal BL, is provided at node N110 where the drain of M102 and the drain of M104 are coupled together.

Because storage transistors M102 and M104 do not need to be turned on during the programming or erase modes, high supply voltage VDD are turned off during those modes. This enables lower current consumption of NVM cell C100 during those modes.

In a read mode, programming voltages are turned off. High supply voltage VDD is turned on along with low supply voltage GND. If the low supply voltage is ground voltage (0V), it may not need to be turned on. A charge level of shared floating gate fg determines whether the inverter comprising storage transistors M102 and M104 provides an inverted output or not when supply voltages are provided. Accordingly, output voltage Vo at node N110 provides a "1" or a "0" bit value depending on the charge level of floating gate fg.

Values of Vo corresponding to "1" and "0" bit values may be determined based on a size and type of M102 and M104, a value of high and low supply voltages, and a value of the switch point voltage for the transistors. In one embodiment, M102, M106, and M108 may be p-type FETs, and M104 an n-type FET.

Figure 1B:
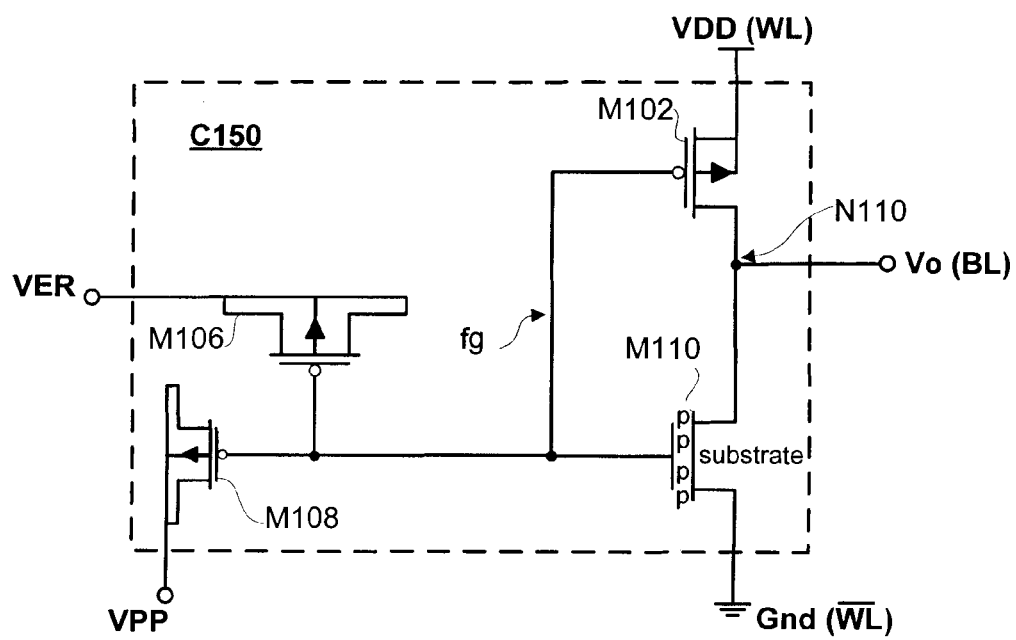
FIG. 1B schematically illustrates another embodiment of an inverter based non-volatile memory (NVM) cell with a floating gate programming circuit.

FIG. 1B schematically illustrates another embodiment of inverter based NVM cell C150 with a floating gate programming circuit.

Components of NVM cell C150 that are similarly numbered in NVM cell 100 of FIG. 1A are arranged to operate in a likewise manner in NVM cell C100. Storage transistor M110 of NVM cell 150 is, however, constructed differently. M110 is a p-doped, polysilicon n-type FET transistor. Doping of the polysilicon n-type FET with p-type impurities provides for longer retention time enhancing the non-volatility of NVM cell 150.

Figure 2:
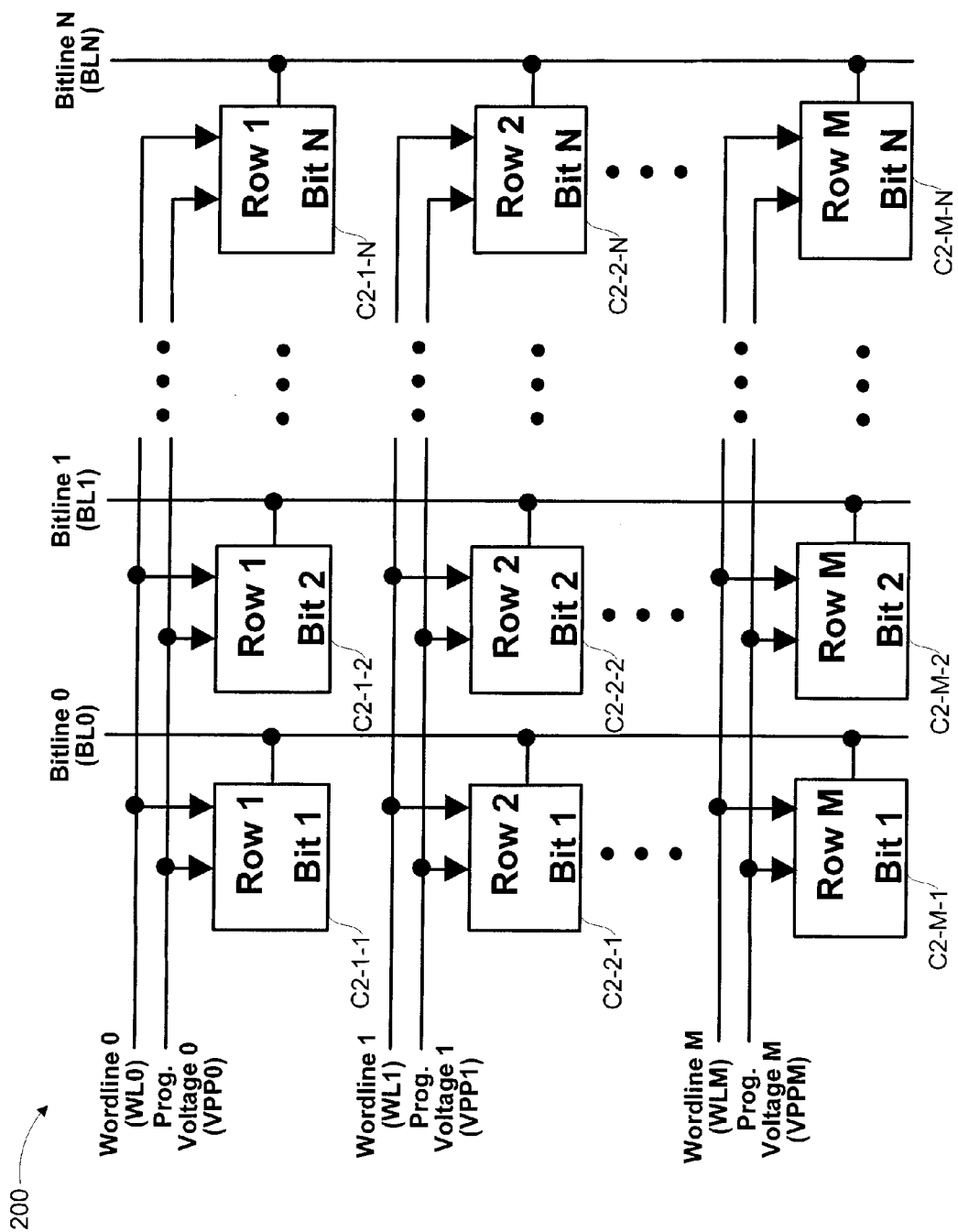
FIG. 2 is a block diagram of an NVM array that includes the NVM cells of FIG. 1A or FIG. 1B according to one embodiment.

FIG. 2 is a block diagram of NVM array 200 that includes the NVM cells C100 or C150 of FIG. 1A and FIG. 1B according to one embodiment. According to some embodiments, an NVM system includes an array of NVM cells configured in rows and columns, each NVM cell comprising a storage element and a programming element, such that each NVM cell is arranged to be programmed, erased, and read based on a plurality of row selection, column selection, and programming signals, where a supply voltage for the storage elements is turned off during a programming mode and an erase mode. The NVM system further includes an inverter circuit for each row of cells that is configured to provide an inverted row selection signal to each row, where the storage element of each NVM cell comprises a field effect transistor (FET) pair that are arranged to share a common floating gate.

As mentioned previously, NVM arrays include a plurality of NVM cells arranged in rows and columns. In NVM array 200, cells C2-1-1 through C2-1-N are arranged in a row storing bits 1 through N, respectively. Similarly, cells C2-2-1 through C2-2-N form the second row storing a second word and cells C2-M-1 through C2-M-N form Mth row storing an Mth word. M and N are integers indicating a maximum row and column number, respectively.

Programming voltages for each row are represented by VPP0 through VPPM. In one embodiment, as described in conjunction with FIGS. 1A and 1B, the programming elements may receive two different programming voltages, VER, and VPP. The programming voltages are shown as one voltage in FIG. 2 for simplicity.

Each row of NVM cells may be selected for read mode operations by word line voltages WL0 through WLM. Word line voltages may be implemented as high supply voltage, such as in the example embodiment of FIGS. 1A and 1B, and employed to turn on the storage elements of each NVM cell within a row.

In a read mode, output voltages of individual NVM cells may be read at the bit lines BL0 through BLN, which are coupled to output nodes of each NVM cell within a corresponding column.

In a read mode operation, rows of NVM cells may be selected by providing a predetermined value of word line voltage to the selected rows. Then, selected NVM cells within each column may be read by selecting a corresponding bit line. For example, if NVM cell C2-2-2 is to be read, first WL1 may be set to the predetermined turn-on value, while other WL's are remain at the predetermined turn-off value. Then, BL1 may be recorded providing the stored bit value in NVM cell C2-2-2. to read the whole NVM array, word line voltages WL0 through WLM may be set to turn-on value one-by-one as other WL's are set to turn-off value, and during each step BL1 through BLN may be read, thereby providing the stored word values for each row individually.

Figure 3:
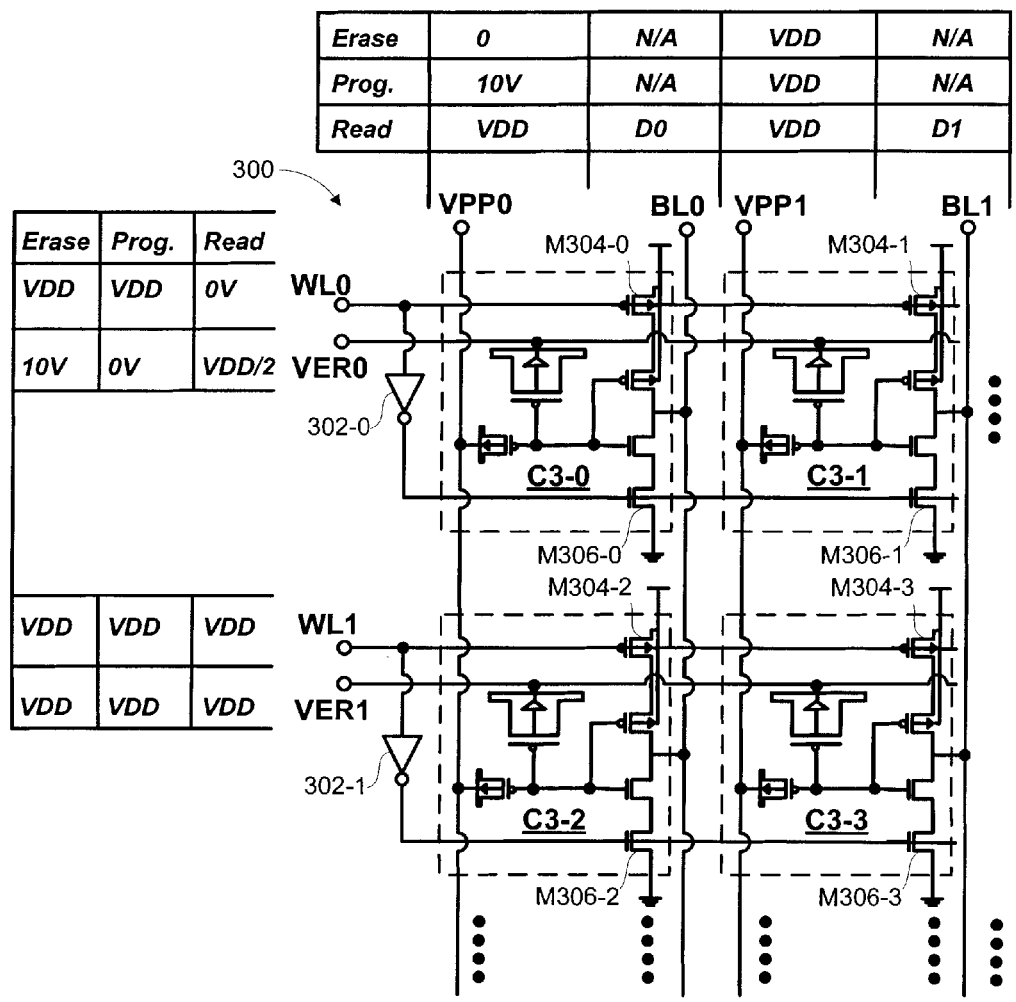
FIG. 3 is a schematic block diagram of one embodiment of an NVM array according to the present invention with an isolation transistor pair in each cell and example values for various voltages for individually selectable bit operation of programming, erase, and read modes.

FIG. 3 is a schematic block diagram of NVM array 300 according to one embodiment with an isolation transistor pair in each cell and example values for various voltages for individually selectable bit operation of programming, erase, and read modes.

NVM array 300 includes four example NVM cells C3-0, C3-1, C3-2, and C3-3. As shown in the figure, individual cells include programming and storage elements similar to those illustrated in FIGS. 1A and 1B. Additionally, each NVM cell includes a pair of isolation transistors M304-X and M306-X, where X denotes cell designator. First isolation transistor M304-X is arranged to be coupled between a high supply voltage VDD and a source terminal of a first storage transistor of the cell. First isolation transistor M304-X is further arranged to receive a word line voltage WLX (again X denoting the cell designator) at a gate terminal. Accordingly, when the word line voltage is set to a predetermined value for selecting a cell, the first isolation transistors in the selected row are turned on providing VDD to the source terminal of the first storage transistor of each cell within the selected row.

Similarly, second isolation transistor M306-X of each cell is coupled between a source terminal of a second storage transistor of each cell and a ground. Second isolation transistor M306-X is arranged to receive an inverted word line voltage. The word line voltage may be inverted by inverter 302-X for each row of NVM cells. Second isolation transistor M306-X is arranged to provide the ground to the drain terminal of the second storage transistors based on the inverted word line signal completing a path for current flow for the storage element in the read mode.

FIG. 3 further includes tables showing example values for word line, bit line, and programming voltages in different operation modes. For example, in an erase mode operation, programming voltages for cell C3-0 may be selected as VER0=0V and VPP0=10V. This results in removal of electrons from the shared gate of storage transistors of cell C3-0 as explained in FIG. 1A storing a low bit value in the cell.

In a programming mode, programming voltages for cell C3-0 may be selected as VER0=10V and VPP0=0V. This results in injection of electrons onto the shared gate of storage transistors of cell C3-0 as explained in FIG. 1A storing a high bit value in the cell.

In both the erase and the programming modes, word line voltages WL0 and WL1 are set to VDD turning off the p-type first isolation transistor (M304-0 through M304-3) and the n-type second transistor (M306-0 through M306-3) in each transistor, thereby turning off the storage elements of each cell in the erase and programming modes.

In a read mode operation, when cells C3-0 and C3-1 are to be read, WL0 is set to 0V turning on the isolation transistors M304-0, M304-1, M306-0, and M306-1, thereby providing VDD and ground signals to the storage elements of cells C3-0 and C3-1. The other two example cells are still turned off. A reading circuit may first read bit line BL0 and determine the bit value stored in cell C3-0, then bit line BL1 and determine the bit value stored in cell C3-1. In an NVM array with N-bit words, bit lines BL0 through BLN may be read consecutively or simultaneously determining the whole word stored in the selected word line.

While NVM array 300 is illustrated with four example cells and particular values for programming and word line selection voltages, the invention is not so limited. Other arrangements of arrays with fewer or more cells and other values of voltages may be selected without departing from the scope and spirit of the invention.

Figure 4:
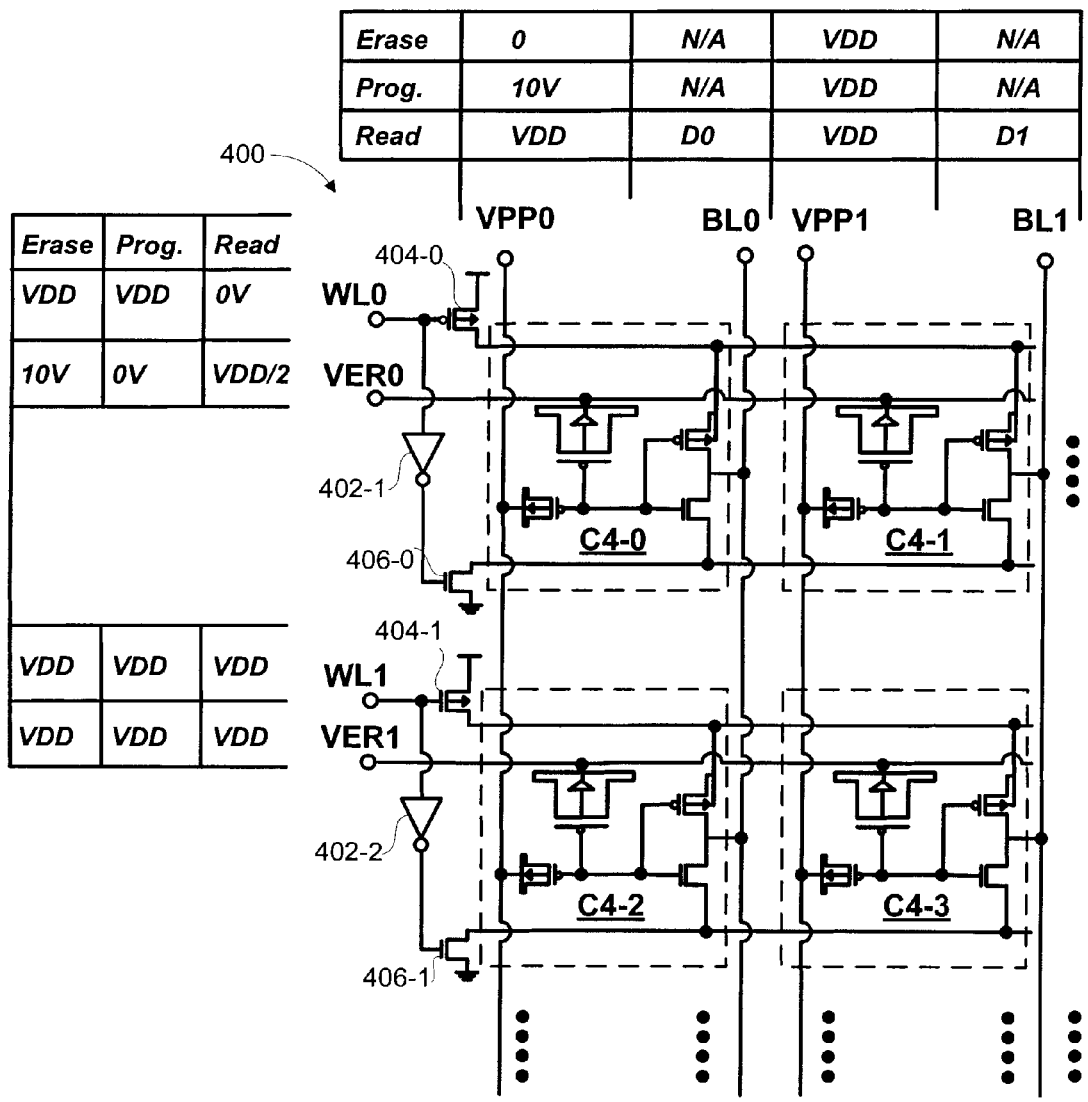
FIG. 4 is a schematic block diagram of another embodiment of the NVM array of FIG. 3 with an isolation transistor pair for each row of cells along with example values for various voltages for individually selectable bit operation of programming, erase, and read modes.

FIG. 4 is a schematic block diagram of NVM array 400 according to another embodiment with an isolation transistor pair for each row of cells along with example values for various voltages for individually selectable bit operation of programming, erase, and read modes.

Components of NVM array 400 that are similarly numbered in NVM array 300 of FIG. 3 are arranged to operate in a likewise manner as in NVM array 300. One difference between the embodiments of FIG. 3 and FIG. 4 is the use of a single pair of isolation transistors 404-X and 406-X for each row in NVM array 400.

Isolation transistors 404-X and 406-X are arranged to be turned on and off by corresponding word line voltage WLX provided to a gate terminal of 404-X and an inverted WLX provided to a gate terminal of 406-X for an Xth word line (row).

Similar to NVM array 300, storage elements of all rows may be turned off by turning off the isolation transistor pairs with corresponding word line voltages during erase and programming modes. In a read mode, supply voltages may be provided to all storage elements of cells within a selected row by providing the appropriate value of word line voltage to the isolation transistors of the selected row and keeping the other isolation transistor pairs turned off. Then, each cell within the selected row may be read bit line by bit line.

Figure 5:
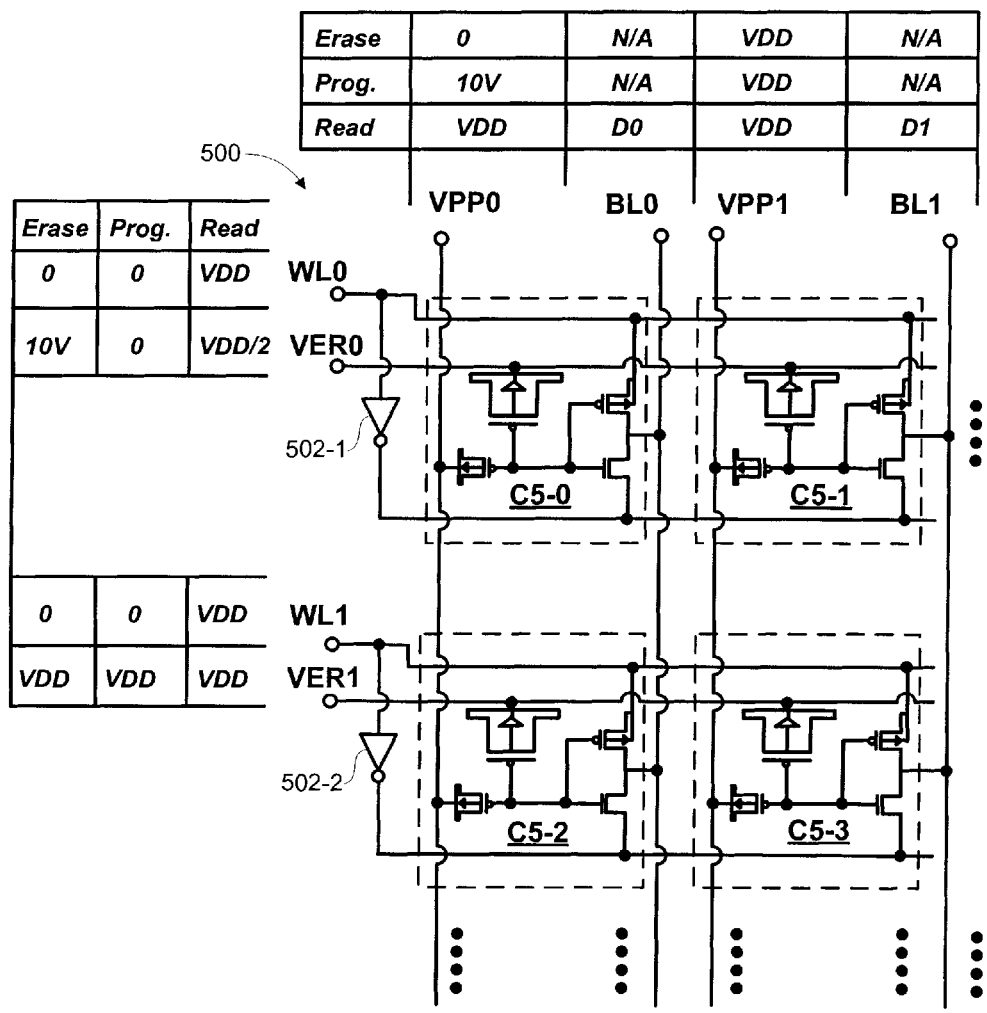
FIG. 5 is a schematic block diagram of a further embodiment of the NVM array of FIG. 3 with no isolation transistor pairs and example values for various voltages for individually selectable bit operation of programming, erase, and read modes.

FIG. 5 is a schematic block diagram of NVM array 500 according to a further embodiment with no isolation transistor pairs and example values for various voltages for individually selectable bit operation of programming, erase, and read modes.

Components of NVM array 500 that are similarly numbered in NVM array 300 of FIG. 3 are arranged to operate in a likewise manner as in NVM array 300. The embodiment represented by NVM array 500 is a more direct approach than NVM arrays 300 and 400.

In NVM array 500, word line voltages are selected to be substantially equal to a high supply voltage for storage elements, in this case VDD. Inverted word line voltage through inverter 502-X is substantially equal to the low supply voltage for the storage elements. Accordingly, when word line voltage is applied to a selected row, all storage elements are provided with supply voltages, while other rows are still turned off.

In FIGS. 3 and 4, the word line voltages WLX do not have to be set at the high supply voltage value, VDD. The word line voltage only needs to turn on the isolation transistors. Therefore, values of word line voltages may be selected based on a type and channel size of the isolation transistors for each particular array, and can be significantly lower than high supply voltage VDD.

While the embodiment represented by NVM array 500 permits more efficient usage of resources such as smaller circuit area, power consumption, and the like, through the elimination of isolation transistors, it also includes the limitation of having the word line voltage be substantially equal to the high supply voltage for the storage elements of the NVM cells.

The examples provided above are for illustration purposes and do not constitute a limitation on the present invention. Other embodiments may be implemented using other arrangements of NVM cells within an NVM array and other implementations of NVM cells without departing from the scope and spirit of the invention.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A non-volatile memory (NVM) system, comprising:
an array of NVM cells configured in rows and columns, each NVM cell comprising a storage element and a programming element, such that each NVM cell is arranged to be programmed, erased, and read based on a plurality of row selection, column selection, and programming signals, wherein a supply voltage for the storage elements is turned off during a programming mode and an erase mode;
and an inverter circuit for each row of cells that is configured to provide an inverted row selection signal to each row,
wherein the storage element of each NVM cell comprises a four field effect transistor (FET) logic circuit in one of a NAND and NOR configuration capable of storing two bits,
wherein each of the FET pairs are arranged to share a common floating gate, and
wherein each FET pair includes a first type FET and a second type FET, and
wherein the programming element comprises two p-FETs coupled together at their gate terminals such that electrons are injected to the common floating gate when a high programming voltage is provided to a source, a drain, and an n-well terminal of a first p-FET of the two p-FETs and a low programming voltage is provided to a source, a drain, and an n-well terminal of a second p-FET of the two p-FETs, wherein the gate terminals of the first and second p-FETs are coupled to the common floating gate of the storage element.

2. The system of claim 1, wherein the storage element is further arranged to serve as a built-in read-out element.

3. The system of claim 1, wherein the second type FET is doped with implants of first type impurities.

4. The system of claim 1, wherein the second type FET is doped with implants of first type impurities and second type impurities.

5. The system of claim 1, wherein the first type is p-type and the second type is n-type.

6. The system of claim 1, wherein the programming element of each NVM cell is arranged to inject electrons to the common floating gate of the storage element and remove electrons from the common floating gate based on the programming signal.

7. The system of claim 1, wherein the programming element is arranged to inject electrons to the common floating gate by at least one of: impact-ionized hot-electron injection, Fowler-Nordheim (FN) tunneling, channel hot-electron tunneling, and band-to-band tunneling induced electron injection.

8. The system of claim 1, wherein the programming element is arranged to remove electrons from the common floating gate by FN tunneling.

9. The system of claim 1, wherein the programming element is arranged to remove electrons from the common floating gate when a low programming voltage is provided to a source, a drain, and an n-well terminal of a first p-FET of the two p-FETs and a high programming voltage is provided to a source, a drain, and an n-well terminal of a second p-FET of the two p-FETs.

10. The system of claim 1, wherein the NVM array is arranged such that a high supply voltage for the storage elements of the NVM cells within an Nth row is provided based on an Nth row selection signal; and the inverter circuit for the Nth row is arranged to provide a low supply voltage to the storage elements of the NVM cells within the Nth row based on the Nth row selection signal, wherein N is an integer corresponding to a row number.

11. The system of claim 10, wherein the NVM array is arranged such that the high supply voltage and the low supply voltage are turned off during the programming mode and the erase mode based on the Nth row selection voltage.

12. The system of claim 10, wherein the NVM array is arranged such that: the high supply voltage for the Nth row of NVM cells is substantially equal to the Nth row selection signal; and the low supply voltage for the Nth row of NVM cells is substantially equal to the inverted Nth row selection signal.

13. The system of claim 10, further comprising: an isolation p-FET for each row that is arranged to provide the high supply voltage to each row based on the row selection signal; and an isolation n-FET for each row that is arranged to provide the low supply voltage to each row based on the inverted row selection signal.

14. The system of claim 13, wherein the isolation p-FET is arranged to: receive the row selection signal at a gate terminal, receive a first supply voltage at a source terminal, and provide the high supply voltage at a drain terminal; and the isolation n-FET is arranged to: receive the inverted row selection signal at a gate terminal, receive a second supply voltage at a source terminal, and provide the low supply voltage at a drain terminal.

15. The system of claim 14, wherein the high supply voltage is substantially equal to the first supply voltage; and the low supply voltage is substantially equal to the second supply voltage, which is substantially equal to a ground voltage.

16. The system of claim 13, wherein each isolation p-FET and each isolation n-FET are arranged to be turned off when the associated row selection signal has a predetermined value.

17. The system of claim 1, further comprising: an isolation p-FET for each NVM cell, wherein the isolation p-FET is arranged to provide a high supply voltage to the NVM cell based on the associated row selection signal; and an isolation n-FET for each NVM cell, wherein the isolation n-FET is arranged to provide a low supply voltage to the NVM cell based on the associated inverted row selection signal.

18. The system of claim 17, wherein the isolation p-FET is arranged to: receive the associated row selection signal at a gate terminal, receive a first supply voltage at a source terminal, and provide the high supply voltage at a drain terminal; and the isolation n-FET is arranged to: receive the associated inverted row selection signal at a gate terminal, receive a second supply voltage at a source terminal, and provide the low supply voltage at a drain terminal.

19. The system of claim 18, wherein the high supply voltage is substantially equal to the first supply voltage; and the low supply voltage is substantially equal to the second supply voltage, which is substantially equal to a ground voltage.

20. The system of claim 18, wherein each isolation p-FET and each isolation n-FET are arranged to be turned off when the associated row selection signal has a predetermined value.

21. A method for operating an array of NVM cells arranged in rows and columns, comprising:
   upon detecting an initiation of a read cycle, turning on selected NVM cells based on row selection signals, wherein each NVM cell includes one of a four-FET logic circuit in NAND configuration and a four-FET logic circuit in NOR configuration capable of storing two bits; and
   reading stored bit values of the selected NVM cells based on a row selection for fast byte or block reading,
   wherein each stored bit value is provided by an associated NVM cell as an output voltage value,
   wherein the array of NVM cells is configured in rows and columns, each NVM cell comprises a storage element and a programming element, such that each NVM cell is arranged to be programmed, erased, and read based on a plurality of row selection, column selection, and programming signals, wherein a supply voltage for the storage elements is turned off during a programming mode and an erase mode,
   wherein the storage element of each NVM cell comprises the four field effect transistor (FET) logic circuit,
   wherein each of the FET pairs are arranged to share a common floating gate, and wherein each FET pair includes a first type FET and a second type FET, and
   wherein the programming element comprises two p-FETs coupled together at their gate terminals such that electrons are injected to the common floating gate when a high programming voltage is provided to a source, a drain, and an n-well terminal of a first p-FET of the two p-FETs and a low programming voltage is provided to a source, a drain, and an n-well terminal of a second p-FET of the two p-FETs, wherein the gate terminals of the first and second p-FETs are coupled to the common floating gate of the storage element.

22. The method of claim 21, wherein turning on the selected NVM cells comprises providing a high supply voltage and a low supply voltage to storage elements of the selected NVM cells.

23. The method of claim 21, wherein turning on the selected NVM cells comprises turning on an isolation p-FET and an isolation n-FET for each selected row such that a high supply voltage and a low supply voltage is provided to storage elements of the selected NVM cells within the selected row.

24. The method of claim 21, wherein turning on the selected NVM cells comprises turning on an isolation p-FET and an isolation n-FET for each selected NVM cell such that a high supply voltage and a low supply voltage is provided to a storage element of the selected NVM cell.

25. The method of claim 21, further comprising: upon detecting an initiation of a programming cycle, turning off storage elements of all NVM cells based on row selection signals; and adjusting a charge storage level of floating gates of the storage elements of selected NVM cells to reflect bit values assigned to the selected NVM cells based on programming signals.

26. The method of claim 25, wherein turning off storage elements of all NVM cells comprises turning off a high supply voltage and a low supply voltage provided to the programming elements of the NVM cells.

27. The method of claim 25, wherein adjusting a charge storage level of floating gates comprises at least one of: injecting electrons to the floating gate and removing electrons from the floating gate.

28. The method of claim 27, wherein injecting electrons to the floating gate is performed by at least one of: impact-ionized hot-electron injection, Fowler-Nordheim (FN) tunneling, channel hot-electron tunneling, and band-to-band tunneling induced electron injection.

29. The method of claim 27, wherein removing electrons from the floating gate is performed by FN tunneling.

30. The method of claim 21, further comprising:
   upon detecting an initiation of an erase cycle, turning off storage elements of all NVM cells based on row selection signals; and
   removing electrons from floating gates of the storage elements of selected NVM cells to reflect zero bit values assigned to the selected NVM cells based on programming signals.

* * * * *